US006687177B2

United States Patent
Kurjanowicz

(10) Patent No.: US 6,687,177 B2
(45) Date of Patent: Feb. 3, 2004

(54) REFERENCE CELLS WITH INTEGRATION CAPACITOR

(75) Inventor: Wlodek Kurjanowicz, Kanata (CA)

(73) Assignee: Atmos Corporation, Kanata (CA)

( * ) Notice: Subject to any disclaimer, the term of this patent is extended or adjusted under 35 U.S.C. 154(b) by 0 days.

(21) Appl. No.: 10/109,879

(22) Filed: Apr. 1, 2002

(65) Prior Publication Data

US 2002/0163844 A1 Nov. 7, 2002

(30) Foreign Application Priority Data

Mar. 30, 2001 (CA) .............................................. 2342508

(51) Int. Cl.<sup>7</sup> ................................................ G11C 7/02
(52) U.S. Cl. ........................ 365/210; 365/145; 365/149; 365/203
(58) Field of Search ................................ 365/210, 145, 365/149, 203

(56) References Cited

U.S. PATENT DOCUMENTS

| 5,392,240 A | | 2/1995 | Muraoka | |
|---|---|---|---|---|
| 5,844,832 A | * | 12/1998 | Kim | 365/145 |
| 5,847,989 A | * | 12/1998 | Seyyedy | 365/145 |
| 5,926,428 A | * | 7/1999 | Rao | 365/207 |
| 6,411,555 B1 | * | 6/2002 | Tran | 365/189.09 |
| 6,418,044 B1 | * | 7/2002 | Laurent | 365/149 |
| 6,452,852 B2 | * | 9/2002 | Bohm et al. | 365/222 |

* cited by examiner

*Primary Examiner*—Richard Elms
*Assistant Examiner*—Toan Le
(74) *Attorney, Agent, or Firm*—Anne Kinsman; Borden, Ladner, Gervais L.L.P.

(57) ABSTRACT

A DRAM having integration capacitors coupled to dummy memory cells of a folded bitline arrangement is disclosed. The dummy memory cells are identical to normal memory cells, and store a midpoint voltage via equalisation between the dummy memory cell having a logic "1" voltage potential and the dummy memory cell having a logic "0" voltage potential. The integration capacitor shares charge with both dummy cell storage capacitors during an equalisation operation to compensate for bitline voltage differences during various access cycle.

18 Claims, 5 Drawing Sheets

REFERENCE CELLS WITH INTEGRATION CAPACITOR

This application claims priority from Canadian Patent application 2,342,508 filed Mar. 30, 2001.

FIELD OF THE INVENTION

The present invention relates to DRAM memories. More particularly the invention relates to bitline reference capacitors used in DRAM memories.

BACKGROUND OF THE INVENTION

Folded bitline DRAM architectures require a reference voltage on the unaccessed bitline of a complementary folded bitline pair in order to sense the voltage potential on the accessed bitline of a complementary folded bitline pair. Prior to a read operation from the memory cells, both bitlines of the complementary bitline pair are precharged to a mid-point voltage level. This mid-point voltage level is approximately a mid-point voltage between the logic "1" voltage potential level and the logic "0" voltage potential level, and can be supplied by voltage generators or through charge sharing by equalizing a pair of bitlines carrying opposite rail-to-rail voltage levels. During a read operation, a wordline is driven to couple a DRAM storage capacitor to one of the bitlines. If the storage capacitor stored a logic "0" charge, then the voltage level of the bitline it is coupled to will drop below the mid-point voltage level. On the other hand, if the storage capacitor stored a logic "1" charge, then the voltage level of the bitline will rise above the mid-point voltage level. The unaccessed bitline of the complementary bitline pair then serves as a reference voltage for the bitline sense amplifier. Unfortunately, the storage capacitor can only change the voltage level of the precharged bitline by a few hundred multi-volts, thus the sensing margin of the bitline sense amplifiers is small and susceptible to mis-reads.

FIG. 1 is a diagram showing the relative bitline voltage levels during a read access operation for prior art DRAM devices. It is assumed that the DRAM memory cells comprise a p-channel access transistor and a planar storage capacitor, and the unaccessed bitline BL is used as the reference bitline in this example. The midpoint voltage level of BL* is reduced through capacitive charge sharing by a memory cell that stores a logical "0" when a wordline WL is driven to the low voltage level. Shortly thereafter, sense amplifier enable signal SN falls to the low logic level to activate the bitline sense amplifiers. The bitline sense amplifiers will detect that the voltage level of BL* is below the mid-point reference voltage of BL and subsequently drive BL* to ground and BL to VDD. The accessed memory cell coupled to BL* is then restored. Mis-reads from the bitlines sense amplifier will not occur if the necessary voltage difference Δv is maintained between the voltage level of the accessed bitline and the reference voltage of the unaccessed bitline.

However, DRAM memory cells exhibits asymmetrical leakage characteristics. More specifically p-channel memory cells storing a logical "0" tend to leak towards a logical "1" value over time, while p-channel memory cells storing a logical "1" do not leak much charge over time. The dashed BL* line in FIG. 1 illustrated the effect of coupling a cell that stored a logic "0" and has suffered leakage to BL*. Because the memory cell has leaked towards the logical "1" value BL* is weakly pulled down to a voltage level above the desired level represented by the solid black line. Hence the voltage difference Δv is reduced and data is unpredictably read because the bitline sense amplifier will not be able to differentiate between the voltage levels of BL and BL*. Furthermore, the memory cell can leak to a point where the level of BL* is increased above the level of BL to cause a misread. A known solution for overcoming this problem is to use reference memory cells connected to each bitline. The reference memory cells, also known as dummy cells, are usually identical to normal memory cells in the memory array. The reference cells are commonly used in full rail bitline precharge schemes. Reference cells or dummy cells can be used to adjust the reference level if either "0" or "1" voltage levels cannot be fully restored. The use of reference cells increases the sense margin to compensate for leakage of the memory cells. Reference cells also provide improved noise immunity and faster sensing, for example.

FIG. 2 is a general diagram of reference cells and an equalization transistor. Each reference cell has a p-channel access transistor with a source terminal connected to a bitline (not shown) and a drain terminal coupled to a storage capacitor. One reference cell has a gate connected to a DWL_ODD reference wordline signal and a drain terminal coupled to storage capacitor C1. The other reference cell has a gate connected to a DWL_EVEN reference wordline signal and a drain terminal coupled to storage capacitor C2. The equalization transistor is a p-channel transistor connected between the two storage capacitors and having a gate connected to an equalization signal EQ for shorting the two storage capacitors together. Although a common cell plate is shown as a dashed box that covers the areas of C1 and C2, those of skill in the art will understand that the cell plate extends to cover all the storage capacitor areas of the memory array.

In operation, both storage capacitors of the reference cells are initially discharged upon power up of the memory. During the first write operation, both the storage capacitors will be precharged to logic high and logic low levels, or logical "1" and "0" levels and then equalized to a mid-point voltage level. A dummy memory cell is then coupled to the unaccessed bitline of a complementary bitline pair during a sense operation from an accessed bitline. When a weak or leaked logic "0" is read from the accessed bitline, the voltage difference between the two bitlines is sufficient for the bitline sense amplifiers to latch the data. After the data is fully latched by the bitline sense amplifiers, the reference cell of the accessed bitline is turned on. Now both storage capacitors C1 and C2 store complementary voltage levels. Therefore, when the wordlines are turned off and the equalisation transistor is turned on, charge is shared equally between C1 and C2 such that both their voltage levels should be at the mid-point voltage level. Although a p-channel equalisation transistor is shown, one skilled in the art should understand that an p-channel transistor would work equally well.

Although the use of reference cells in the above mentioned application can improve sense margins for memory cells leaking stored logical "0" levels, misreads can still occur if the reference cells themselves are not adequately charged to the mid-point voltage level. This problem occurs in high speed memory operations where the cycle time is too short to allow the reference cell to be fully restored prior to a subsequent operation, or if the access transistor wordline cannot be sufficiently boosted to pass the full voltage level. This problem also occurs if the restoration cycle is sufficiently different from the cycle used to restore sensed cells, and is more prevalent following write operations, as the write operation is typically shorter in duration than a read operation, leaving less time available for restoring the charges of the reference cells. The latter problem typically occurs in planar memory cells that utilize low voltage transistors. For example, one reference cell may not be able to store full logic "1" level while the other reference cell stores a full logic "0" level. When equalized, both reference cells will have stored a reference voltage less than the mid-point voltage level. This will degrade the capability of bitline sense amplifiers to accurately read out data from an accessed bitline, and in particular, from a leaking memory cell.

Therefore, there is a need for a reference cell equalisation circuit that compensates for reference cells that are unable to equalize to a mid-point voltage level for reliable bitline sensing operations. There is also a need for a reference cell arrangement that allows for fast equalisation of the reference cells for high speed operation using low leakage connections and minimized area. There is also a need for margin test capabilities through access to the reference cell voltage level.

SUMMARY OF THE INVENTION

The object of the present invention is to mitigate or obviate at least one disadvantage with previous reference cells. In particular, it is an object of the present invention to provide a bitline reference circuit having an integration capacitor for compensating the reference cell storage capacitors such that their stored mid-point voltage levels are adjusted towards the true mid-point voltage level.

In a first aspect, the present invention provides a DRAM bitline reference circuit that includes a reference storage capacitor coupled to each bitline of a complementary pair of bitlines. The bitline reference circuit includes an integration capacitor for sharing charge with the reference storage capacitors, a precharge circuit for charging the integration capacitor to a reference voltage level, and an equalization circuit for coupling the integration capacitor to the reference storage capacitors.

In alternate embodiments of the present aspect, the reference storage capacitors and the integration capacitor are planar, p-channel capacitors. In yet another embodiment of the present aspect, the equalization circuit includes a p-channel transistor having a source terminal connected to the capacitor, a drain terminal connected to the reference storage capacitors, and a gate connected to an equalization signal. Alternatively, the equalization circuit includes a first p-channel transistor having a source terminal connected to the capacitor and a drain terminal connected to one of the reference storage capacitors, and a second p-channel transistor having a source terminal connected to the capacitor and a drain terminal connected to the other of the reference storage capacitors, and the first and second p-channel transistors have their gates connected to an equalization signal.

In a further embodiment of the present aspect, the precharge circuit includes a p-channel transistor for coupling a reference voltage to the integration capacitor in response to a start-up signal, where the reference voltage is the same as a bitline precharge voltage.

In a second aspect, the invention provides a method for equalizing a first reference memory cell storage capacitor and a second reference memory cell storage capacitor coupled to a complementary pair of bitlines. The method includes precharging an integration capacitor, the first reference memory cell storage capacitor and the second reference memory cell storage capacitor to a reference voltage level, where the reference voltage level is adjusted in a test mode, driving the complementary pair of bitlines to complementary voltage levels, charging the first and second reference memory cell storage capacitors through the complementary pair of bitlines, and equalizing the first reference memory cell storage capacitor, the second reference memory cell storage capacitor and the integration capacitor to each other.

In an alternative embodiment of the present aspect, the integration capacitor and the storage capacitors are precharged during a power up phase. In an alternate embodiment of the present aspect, a wordline is activated to couple a memory cell storage capacitor to one bitline of the complementary pair of bitlines and a dummy wordline is activated to couple the first reference memory cell storage capacitor to the other bitline of the complementary pair of bitlines after precharging.

In yet another embodiment of the present aspect, the complementary pair of bitlines are driven to the complementary voltage levels by a bitline sense amplifier, and another dummy wordline is activated to couple the second reference memory cell storage capacitor to the one bitline of the complementary pair of bitlines.

In a third aspect, the present invention provides A DRAM bitline reference circuit. The bitline reference circuit includes a first reference cell having an access transistor and a storage capacitor, a second reference cell having an access transistor and a storage capacitor, a bitline coupled to the first reference cell, a complementary bitline coupled to the second reference cell, an integration capacitor, a precharge transistor for coupling a reference voltage to the integration capacitor, and an equalization circuit for coupling the integration capacitor to the storage capacitors of the first and second reference cells.

In an alternative embodiment of the present aspect, the equalization circuit includes a first transistor for coupling the integration capacitor to the storage capacitor of the first reference cell, and a second transistor for coupling the integration capacitor to the storage capacitor of the second reference cell.

In another embodiment of the present aspect, the access transistor gate of the first reference cell is connected to a first dummy wordline, and the access transistor gate of the second reference cell is connected to a second dummy wordline. In yet another embodiment of the present aspect, the transistors are p-channel transistors.

In a fourth aspect, the present invention provides A DRAM memory. The DRAM memory includes a DRAM bitline reference circuit having a reference storage capacitor coupled to each bitline of a complementary pair of bitlines, the bitline reference circuit including an integration capacitor for sharing charge with the reference storage capacitors, a precharge circuit for charging the integration capacitor to a reference voltage level, and an equalization circuit for coupling the integration capacitor to the reference storage capacitors.

BRIEF DESCRIPTION OF THE DRAWINGS

Embodiments of the present invention will now be described, by way of examples only, with reference to the attached Figures, wherein.

DETAILED DESCRIPTION

A DRAM having integration capacitors coupled to dummy memory cells, also referred to as reference memory cells, of a folded bitline arrangement is disclosed herein. The dummy memory cells are substantially the same as normal memory cells, that are used to provide reference voltages representing the different logic states of the memory cells and are not used to store data. In a presently preferred embodiment, an integration capacitor is coupled in parallel to first and second dummy cells that store the voltages representing logic "1" and logic "0" respectively. In combination the two dummy cells provide a midpoint voltage that is achieved by equalising the voltage between the dummy memory cell having a voltage potential representing a logic "1" value, and the dummy memory cell having a voltage potential representing a logic "0" value using an equilisation transistor. The integration capacitor compensates for differences in logic "0" and "1" voltage levels to ensure that the reference cells are maintained at the proper mid-point voltage level after a read operation.

Figure 1:
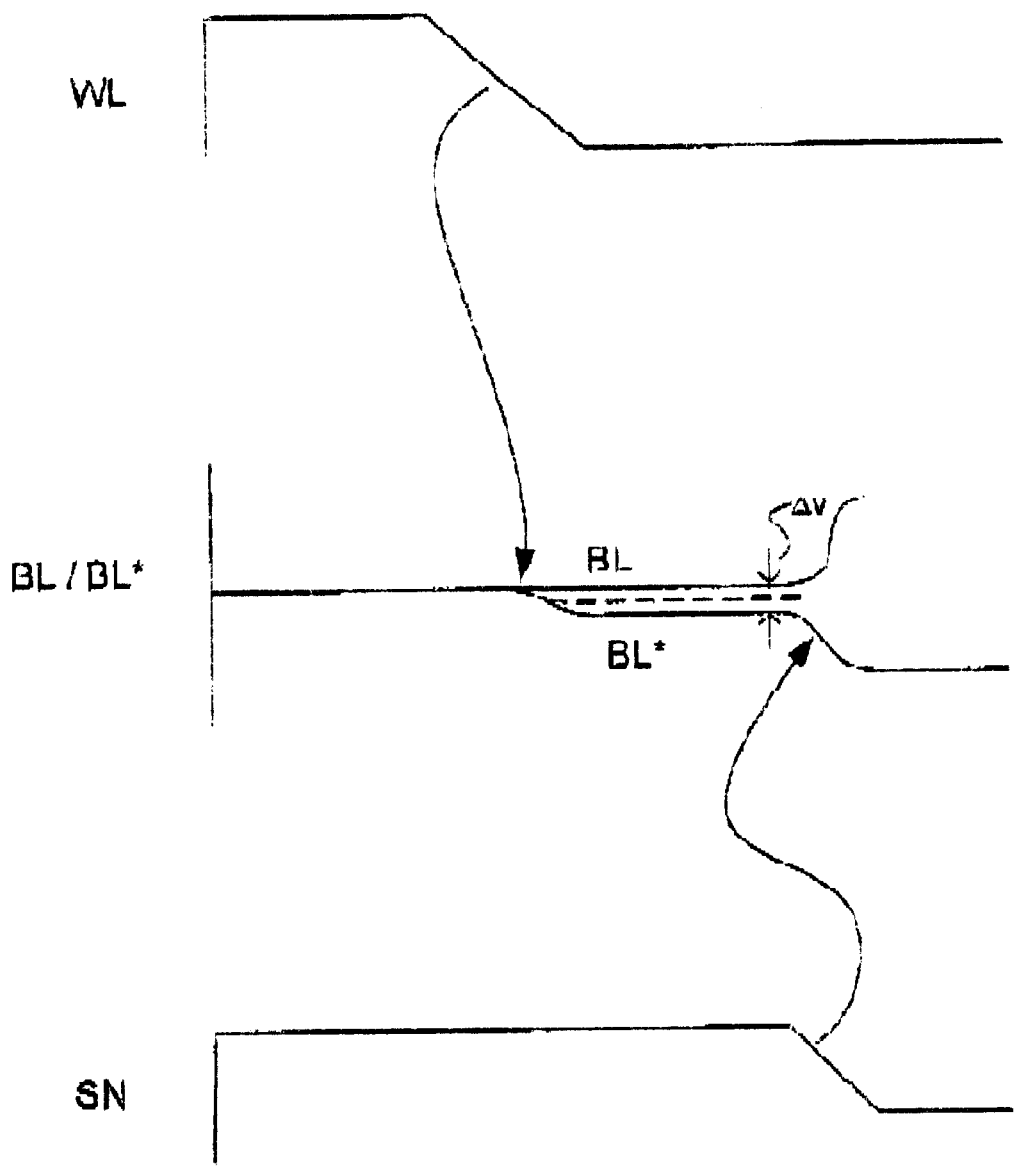
FIG. 1 is a diagram illustrating bitline voltages during a sensing operation in prior art DRAM devices.
Figure 2:
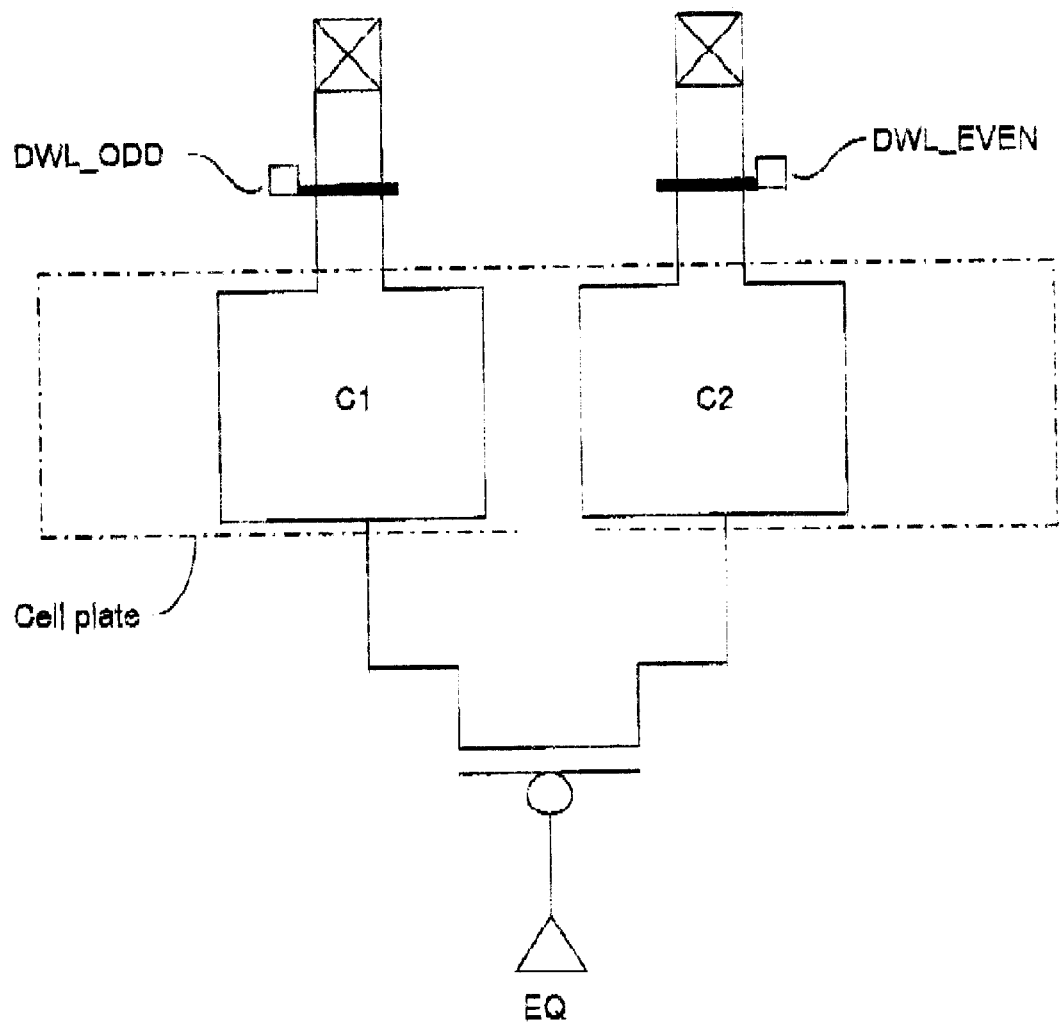
FIG. 2 is a general diagram of a reference cell equalisation circuit of the prior art.
Figure 3:
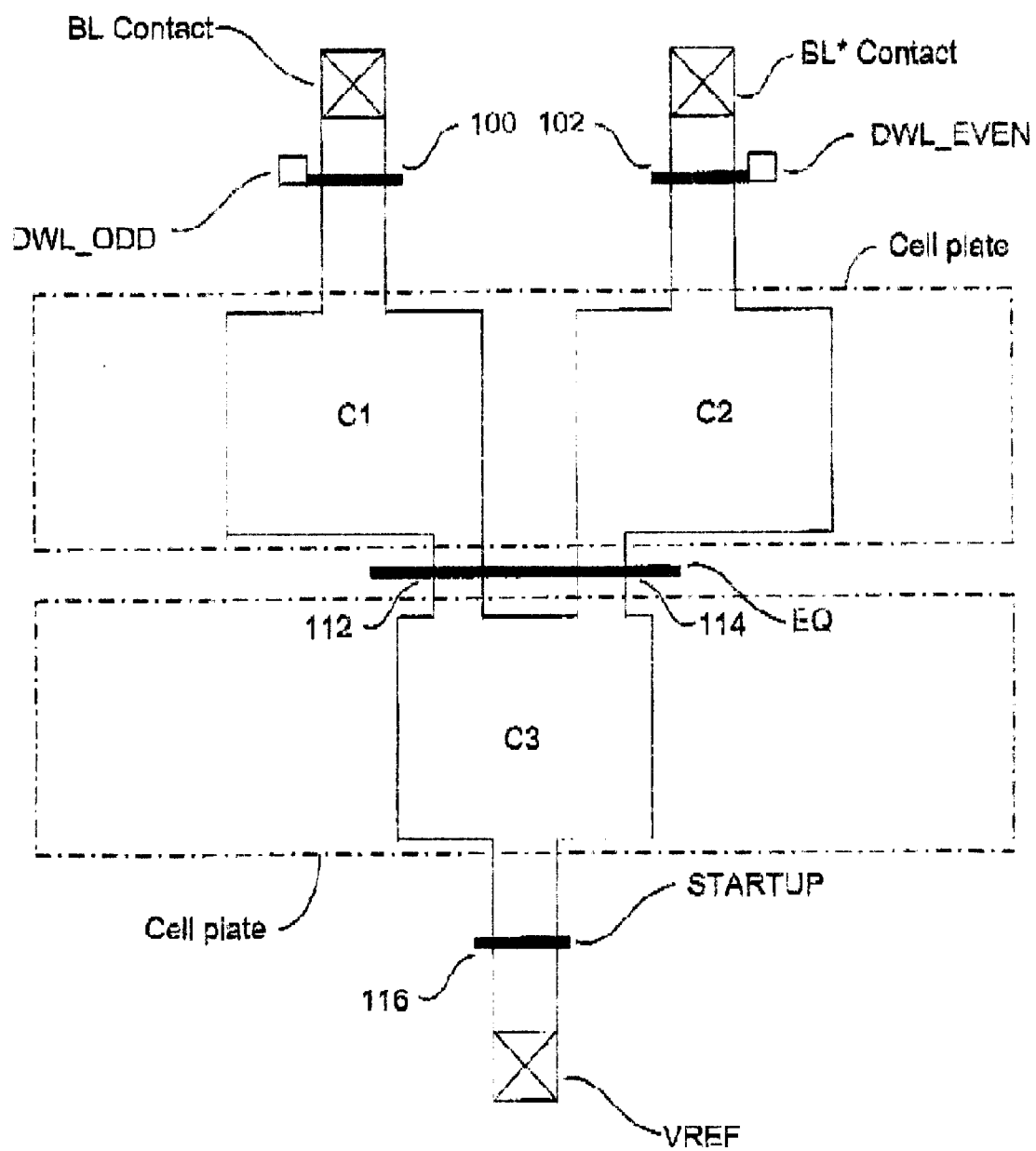
FIG. 3 shows a layout of the reference cell precharge circuit according to an embodiment of the present invention.

FIG. 3 shows a layout of reference cells and an integration capacitor according to an embodiment of the present invention. Full size reference cells, also referred to as dummy cells, are used in the presently preferred embodiment to make sensing independent from bitline precharge levels. This is useful for planar cell applications where the wordline and back bias boosting is limited, since low voltage transistors are used in this embodiment. FIG. 3 includes access transistors 100 and 102 of respective reference cells for coupling BL and BL*, via bitline contacts, to storage capacitors C1 and C2 respectively. An integration capacitor C3 is coupled to both storage capacitors C1 and C2 through a pair of p-channel equalization transistors having their gates connected to equalization signal EQ. An additional p-channel transistor having its gate connected to start-up signal STARTUP coupled C3 to a bitline precharge voltage VREF, VREF is usually the same voltage used to precharge the bitlines to a mid-point voltage level, and is preferably at the ½ VDD voltage level. Without negative boosting of wordlines, for example boosting of DWL_ODD and DWL_EVEN, it is difficult to transfer a full charge from a bitline to the reference storage capacitor. The reference cells and integration capacitor shown in FIG. 3 are included in each complementary bitline pair in the memory array, and placed at either ends of the complementary bitline pairs. In general operation, signal STARTUP and EQ are brought low for precharging C1, C2 and C3 to the VREF level prior to any read operation, such as in a power up phase of the DRAM, for example. After the first write and each subsequent read or write operation C1 and C2 will store complementary voltage levels, and EQ is subsequently brought low for coupling C1, C2 and C3 to each other. Although not shown in FIG. 3, those of skill in the art would understand that a cell plate biased to a cell plate voltage VCP covers the storage capacitor active areas of all the memory cells.

Figure 4:
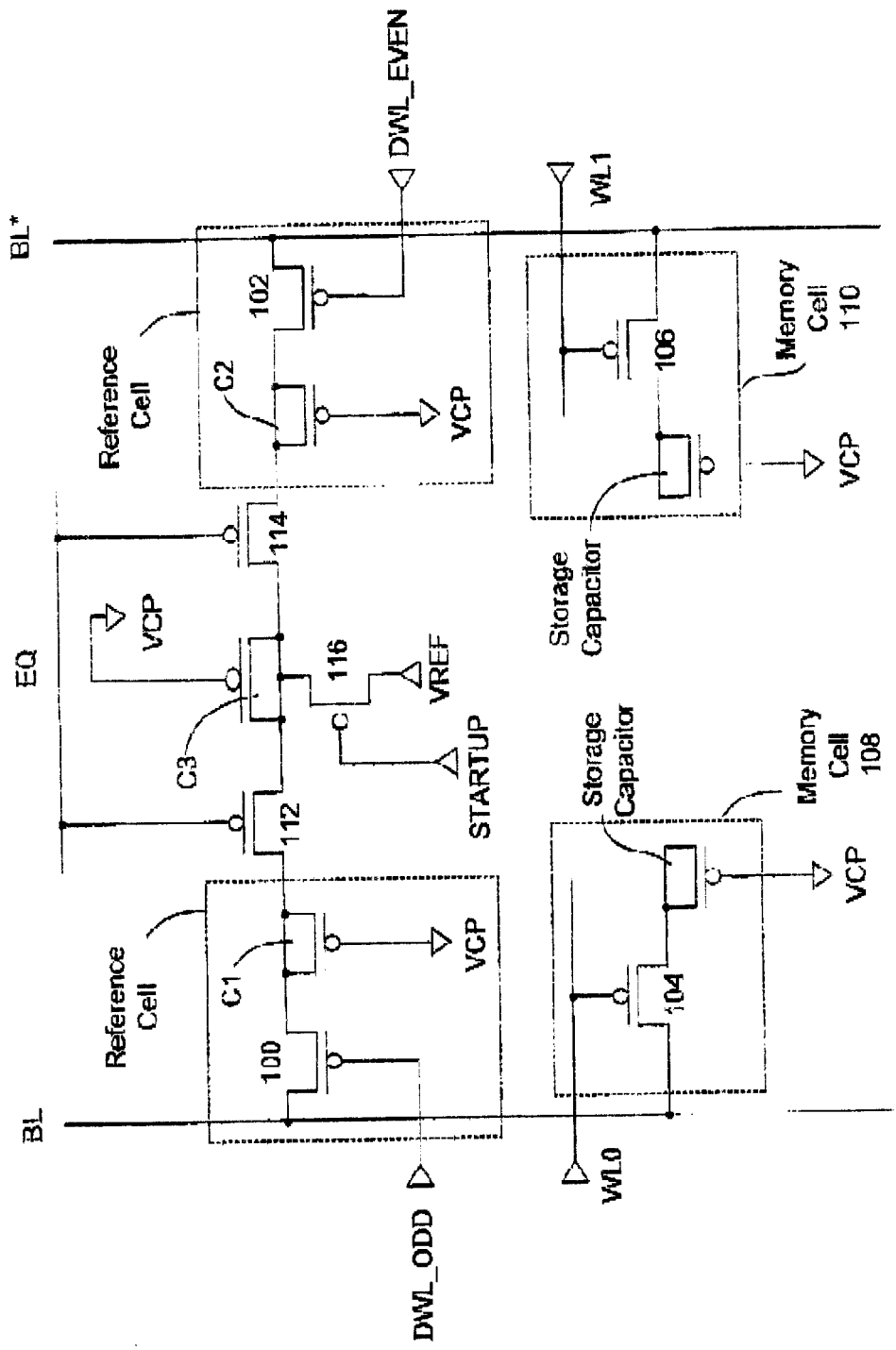
FIG. 4 shows a circuit schematic corresponding to the layout shown in FIG. 3; and, FIG. 5 is a sequence diagram illustrating bitline voltages during a sensing operation using the circuit of FIG. 4.

FIG. 4 shows a circuit schematic corresponding to the layout of the present invention shown in FIG. 3. This layout Is clearly only illustrative, and is not meant to be limiting of the scope of the present invention as one of skill in the art will readily appreciate that numerous modifications to the circuit can be made without departing from the scope of the present invention. FIG. 4 shows a first reference cell having its storage capacitor C1 coupled to bitline BL through access transistor 100, and a second reference cell having its storage capacitor C2 coupled to bitline BL through access transistor 102. The first and the second reference cell storage capacitors C1 and C2 are coupled to Integration capacitor C3 through respective equalization transistors 112 and 114 Although the present embodiment illustrates the use of two equalization transistors, a single equalization transistor having a source terminal connected to C3 and a drain terminal connected to both C1 and C2 can be used in alternate embodiments. The cell plates of all the storage capacitors are biased to a cell plate voltage VCP. Dummy wordlines DWL_ODD and DWL_EVEN are connected to the gates of access transistors 100 and 102 respectively, for coupling storage capacitors C1 and C2 to their respective bitlines. Integration capacitor C3 is coupled to bitline precharge voltage VREF through precharge transistor 116. The complementary bitelines, BL and BL*, are also connected to a plurality of memory cells. For example, BL is connected to memory cell 108 through access transistor 104, while BL* is connected to memory cell 110 through access transistor 106. Access transistor 104 Is controlled by wordline WL0 and access transistor 106 is controlled by WL1 for coupling their respective storage capacitors to BL and BL*. Although not shown In FIG. 4, the bulk terminal of each PMOS transistor is connected to a proper biasing voltage level, such as VPP for example.

Figure 5:
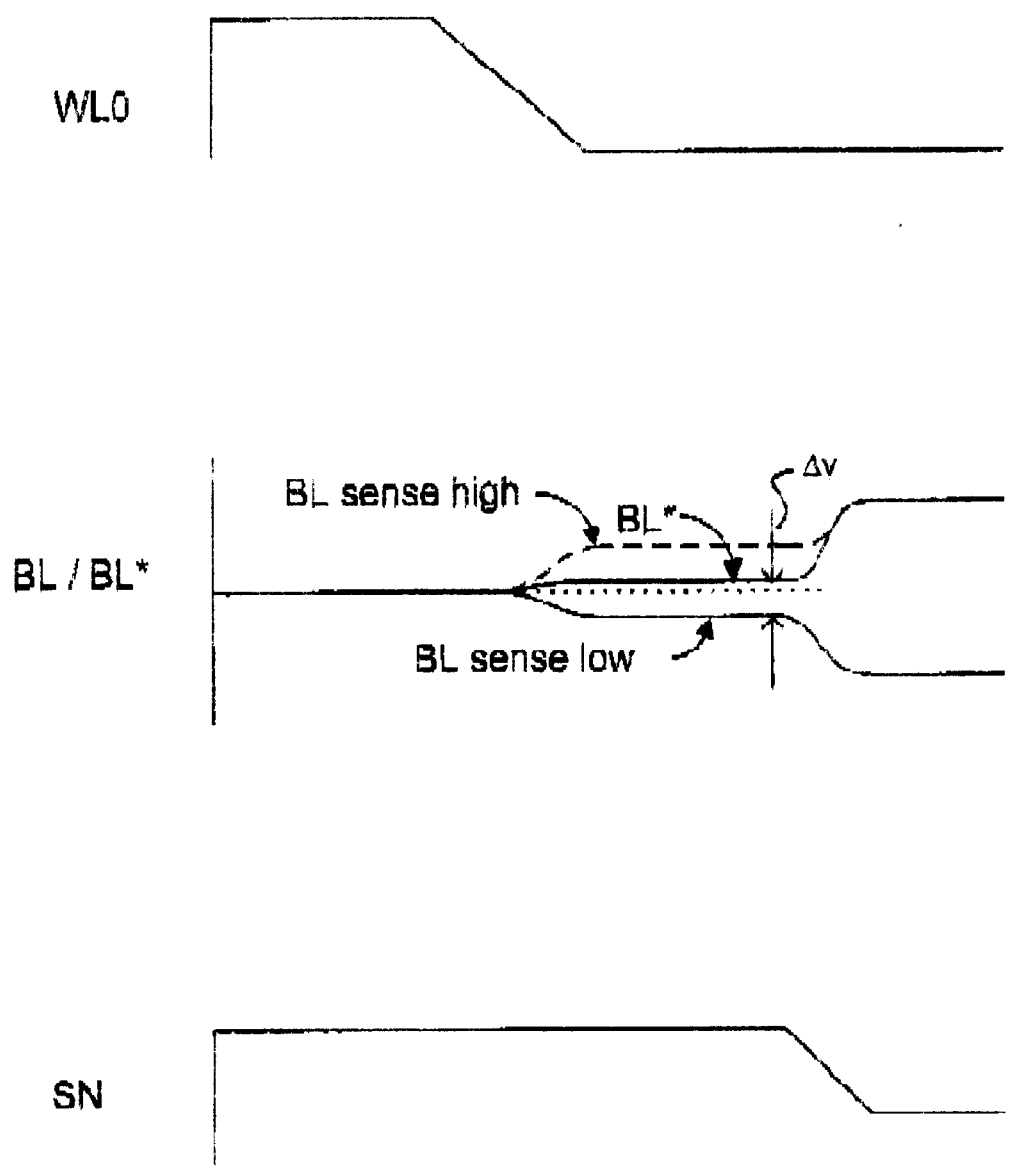

A general read operation for illustrating the operation of the reference cell circuits and the integration capacitor are now described with reference to FIGS. 4 and 5. FIG. 5 shows traces for a wordline WL0, a complementary bitline pair BL/BL* and bitline sense amplifier enable signal SN. The following example assumes that a logical "0" is stored in memory cell 108.

In FIG. 4 after powerup, both signals STARTUP and EQ are brought low to set the initial voltage on C1, C2 and C3 to VREF. All the bitlines are precharged to the mid-point voltage level of VREF and STARTUP is then forced high. EQ stays low until a row in the memory array is accessed. Prior to any wordlines being brought low. EQ is driven high to turn off equalization transistors 112 and 114. In order to access the data stored in memory cell 108, WL0 is brought to a low voltage, which turns on the access transistor 104. In FIG. 5, this even is illustrated by WL0 dropping to the low logic level. This results in charge sharing between the bitline and the storage capacitor of memory cell 108.

Consequently the voltage BL drops slightly as illustrated in FIG. 5. At the same time that WL0 is brought low, DWL_EVEN is brought low, which couples reference capacitor C2 to BL*. It is noted that prior to activation of WL0, the stored "0" in memory cell 108 and the mid-point voltage level initially set in storage capacitors C1 and C2 are leaking towards the logical "1" level. The activation of the access transistor 102 results in charge sharing between BL* and the reference capacitor C2 such that the voltage of BL* increases slightly as illustrated in FIG. 5. The sense amplifier is then activated by driving signal SN in FIG. 5 to the low logic level, which then drives BL and BL* to their full voltage levels representing logic "0" and "1" respectively. As the access transistors 100 and 102 are still turned on, these full levels are written back into the reference cells. After the sense amplifier has fully driven the bitlines, DWL_ODD is then brought low, which allows a full logic "0" level to be written into C1 while a full logic "1" level is written into C2. After the restore operation is complete, all wordlines and dummy wordlines are forced high, which turns off all the access transistors. The EQ signal is then brought low and the charge stored on C1 and C2 is averaged out across C1, C2 and C3. Therefore, if either C1 or C2 was not restored to a full logic "0" and "1" level, then averaging of the stored charge across C1, C2 and C3 will compensate C1 and C2 such that their stored mid-point voltage levels are adjusted towards the true mid-point voltage level. If memory cell 108 stored a logical "1" value, then the voltage level of BL is increased as illustrated in FIG. 5 by the dashed line. Note that the charge sharing between memory cell 108 that stores a logical "1" value and BL will increase the voltage on BL to a higher level than that induced on BL by its reference cell. The resulting voltage level of BL is typically about an order of magnitude greater than the voltage level of BL*.

Conversely, to access the data stored in the memory cell 110, WL1 and DWL_ODD are brought low. The data is read out onto the bitlines and the sense amplifier is activated which results in the bitlines being driven to their full levels. Then DWL_EVEN is activated to write the full logic "1" value into storage capacitor C2. Then all wordlines and dummy wordlines are brought high and storage capacitors C1 and C2 are equalised.

As previously mentioned for a DRAM such as that shown in FIG. 4, a stored logical "1" value will tend not to leak away. However, a stored "0" will tend to leak towards the value "1" as will the stored mid-point value. For reasons well known in the art, the "0" will leak at a faster rate than the midpoint voltage. If the array is not accessed for a period of time all the stored "0" levels will tend to move towards the "1" value. Thus the mid-point stored on C1 and C2, which is an average of the voltages of a logical "1" and a logical "0" will also move towards the "1" value. When the array is subsequently accessed, the reference cell will induce a slightly higher voltage on its bitline which should be representative of the average voltage of the data. The accessed memory cell will couple its storage capacitor to its bitline, and the bitline sense amplifier will operate on the accessed bitline voltage level and the reference voltage level of the unaccessed bitline. As rows are subsequently accessed, the value stored on the integration capacitor will move towards the true midpoint, reflecting the fact that the data has been recently accessed.

By using integration capacitor C3, the reference level stored in the reference cells is adjusted to.

$$V_R = \frac{(V0+V1)C+(V_{ave} \times C3)}{2C+C3},$$

where V0, V1, and $V_{ove}$ represent the voltage associated with logic "0", logic "1", and average respectively. The charge QR=VR+C will be introduced into reference BL during activation. Capacitor C3 compensates for "0" and "1" differences during various access cycles.

In alternative embodiments of the present invention, the size of capacitor C1 can be adjusted to allow control over the degree of integration desired, and is preferably at least the same size as capacitors C1 and C2. Although the degree of integration increases as the size of capacitor C1 increases, its size is limited by the area or space available between complementary bitlines. The precharge signal STARTUP can be pulsed to additionally compensate for an offset, either connecting momentarily to VREF or to other another reference voltage VREF. This could be done based on the information stored in a dummy column. Such system could compensate for the leakage associated with refreshing the individual rows. Furthermore, the embodiments of the present invention are not limited to DRAM cells having planar storage capacitors, but are also applicable to DRAM cells having trench or stacked storage capacitors. VREF can be adjusted in a test mode to determine the optimum level for customized memory arrays.

In yet another alternative embodiment of the present invention, an additional reference column can be added to modify the reference cell action through either timing or offset in the sense amplifier action, or in other ways, known to one of skill in the art, to compensate for the elapsed time difference between the reference cell restore and sensed cell restore operation.

The above-described embodiments of the invention are intended to be examples of the present invention. Alterations, modifications and variations may be effected the particular embodiments by those of skill in the art, without departing from the scope of the invention which is defined solely by the claims appended hereto.

What is claimed is:

1. A DRAM bitline reference circuit including a reference storage capacitor coupled to each bitline of a complementary pair of bitlines, comprising:

an integration capacitor for sharing charge with the reference storage capacitors; a precharge circuit for charging the integration capacitor to a reference voltage level; and, an equalization circuit for coupling the integration capacitor to the reference storage capacitors.

2. The bitline reference circuit of claim 1, wherein the reference storage capacitors and the integration capacitor are p-channel capacitors.

3. The bitline reference circuit of claim 1, wherein the reference storage capacitors and the integration capacitor are a planar capacitors.

4. The bitline reference circuit of claim 1, wherein the equalization circuit includes a p-channel transistor having a source terminal connected to the integration capacitor, a drain terminal connected to the reference storage capacitors, and a gate connected to an equalization signal.

5. The bitline reference circuit of claim 1, wherein the equalization circuit includes a first p-channel transistor having a source terminal connected to the integration capacitor and a drain terminal connected to one of the reference storage capacitors, and a second p-channel transistor having a source terminal connected to the integration capacitor and a drain terminal connected to the other of the reference storage capacitors, the first and second p-channel transistors having their gates connected to an equalization signal.

6. The bitline reference circuit of claim 1, wherein the precharge circuit includes a p-channel transistor for coupling a reference voltage to the integration capacitor in response to a start-up signal.

7. The bitline reference circuit of claim 6, wherein the reference voltage is the same as a bitline precharge voltage.

8. A method for equalizing a first reference memory cell storage capacitor and a second reference memory cell storage capacitor coupled to a complementary pair of bitlines comprising:

a) precharging an integration capacitor, the first reference memory cell storage capacitor and the second reference memory cell storage capacitor to a reference voltage level;

b) driving the complementary pair of bitlines to complementary voltage levels;

c) charging the first and second reference memory cell storage capacitors through the complementary pair of bitlines; and, d) equalizing the first reference memory cell storage capacitor, the second reference memory cell storage capacitor and the integration capacitor to each other.

9. The method of claim 8, wherein the integration capacitor and the storage capacitors are precharged during a power up phase.

10. The method of claim 8, wherein a wordline is activated to couple a memory cell storage capacitor to one bitline of the complementary pair of bitlines and a dummy wordline is activated to couple the first reference memory cell storage capacitor to the other bitline of the complementary pair of bitlines after precharging.

11. The method of claim 10, wherein the complementary pair of bitlines are driven to the complementary voltage levels by a bitline sense amplifier.

12. The method of claim 11, wherein another dummy wordline is activated to couple the second reference memory cell storage capacitor to the one bitline of the complementary pair of bitlines.

13. The method of claim 8, wherein the reference voltage level is adjusted in a test mode.

14. A DRAM bitline reference circuit comprising:
a first reference cell having an access transistor and a storage capacitor;
a second reference cell having an access transistor and a storage capacitor;
a bitline coupled to the first reference cell;
a complementary bitline coupled to the second reference cell;
an integration capacitor;
a precharge transistor for coupling a reference voltage to the integration capacitor, and, an equalization circuit for coupling the integration capacitor to the storage capacitors of the first and second reference cells.

15. The DRAM bitline reference circuit of claim 14, wherein the equalization circuit includes
a first transistor for coupling the integration capacitor to the storage capacitor of the first reference cell; and,
a second transistor for coupling the integration capacitor to the storage capacitor of the second reference cell.

16. The DRAM bitline reference circuit of claim 14, wherein the access transistor gate of the first reference cell is connected to a first dummy wordline, and the access transistor gate of the second reference cell is connected to a second dummy wordline.

17. The DRAM bitline reference circuit of claim 15, wherein the access transistors of the first and second reference cells, the precharge transistor, and the first and second transistors are p-channel transistors.

18. A DRAM memory comprising:
a DRAM bitline reference circuit having a reference storage capacitor coupled to each bitline of a complementary pair of bitlines, the bitline reference circuit including
an integration capacitor for sharing charge with the reference storage capacitors;
a precharge circuit for charging the integration capacitor to a reference voltage level; and,
an equalization circuit for coupling the integration capacitor to the reference storage capacitors.

* * * * *